(12) United States Patent
Matsumura

(10) Patent No.: US 7,273,692 B2
(45) Date of Patent: *Sep. 25, 2007

(54) PLANOGRAPHIC PRINTING PLATE MATERIAL AND PLANOGRAPHIC PRINTING PLATE PREPARING PROCESS

(75) Inventor: Toshiyuki Matsumura, Fujino-machi (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 36 days.

This patent is subject to a terminal disclaimer.

(21) Appl. No.: 10/896,206

(22) Filed: Jul. 20, 2004

(65) Prior Publication Data

US 2005/0053866 A1 Mar. 10, 2005

(30) Foreign Application Priority Data

Aug. 21, 2003 (JP) ............................. 2003-297264

(51) Int. Cl.
G03F 7/031 (2006.01)
G03F 7/029 (2006.01)

(52) U.S. Cl. ............................. 430/284.1; 430/271.1; 430/302; 430/309; 430/435; 430/494; 430/944; 430/945

(58) Field of Classification Search ............. 430/270.1, 430/281.1, 283.1, 284.1, 286.1, 288.1, 302, 430/309, 434, 435, 494, 944, 945, 271.1
See application file for complete search history.

(56) References Cited

U.S. PATENT DOCUMENTS 4,239,850 A * 12/1980 Kita et al. ............... 430/281.1
4,251,619 A 2/1981 Kurita
6,475,700 B1 * 11/2002 Higashi et al. .......... 430/278.1
2004/0023136 A1 * 2/2004 Munnelly et al. ............. 430/18
2004/0091816 A1 * 5/2004 Matsumura et al. ..... 430/281.1
2004/0157153 A1 * 8/2004 Takamuki ................ 430/270.1
2004/0157154 A1 * 8/2004 Kuroki et al. ........... 430/270.1
2005/0037286 A1 * 2/2005 Hirabayashi et al. .... 430/281.1

FOREIGN PATENT DOCUMENTS

| EP | 1 413 925 | | 4/2004 |
| EP | 1 413 925 A2 | * | 4/2004 |
| EP | 1 428 676 | | 6/2004 |
| EP | 1 428 676 A2 | | 6/2004 |
| EP | 1 445 655 | | 8/2004 |
| EP | 1 445 655 A1 | | 8/2004 |
| EP | 1 452 916 | | 9/2004 |
| JP | 2004-295024 A | * | 10/2004 |
| WO | WO 00 48836 | | 8/2000 |

* cited by examiner

Primary Examiner—Barbara L. Gilliam
(74) Attorney, Agent, or Firm—Lucas & Mercanti, LLP

(57) ABSTRACT

Disclosed are a planographic printing plate material and a planographic printing plate preparing process, the planographic printing plate material comprising a support and provided thereon, an image formation layer containing a colorant (a) having an absorption band in a wavelength region of from 700 to 1200 nm, a polymerization initiator (b) and a polymerizable ethylenically unsaturated compound (c), wherein the polymerization initiator (b) is a compound represented by the formula $R^1—CX_2—(C=O)—R^2$.

8 Claims, No Drawings

PLANOGRAPHIC PRINTING PLATE MATERIAL AND PLANOGRAPHIC PRINTING PLATE PREPARING PROCESS

FIELD OF THE INVENTION

The present invention relates to a planographic printing plate material and a planographic printing plate preparing process, and particularly to a planographic printing plate material with high sensitivity and providing high printing durability, which is used in a computer to plate (hereinafter referred to as CTP) system, and a process of preparing a planographic printing plate employing the same.

BACKGROUND OF THE INVENTION

In recent years, as a printing plate for off-set printing, a large number of CTP systems have been developed and put into practical use, which imagewise exposes directly to a planographic printing plate material employing laser light based on digital image data to record an image on the material. As the CTP systems, there are a silver salt system, a radical polymerization system and a thermal system, which differ in characteristics. With development of a solid laser or semiconductor laser with high output power which emits near infrared light, CTP systems recording with near infrared light, so-called thermal CTP systems has been developed and widely applied.

A planographic printing plate material (printing plate material for CTP) used in the thermal CTP is disclosed in U.S. Pat. No. 5,340,699 which comprises an image recording layer containing an infrared absorbing agent, an acid generating agent, a resol resin, and a novolak resin. In this printing plate material for CTP, imagewise exposure produces an acid is imagewise produced at exposed portions due to interaction of the infrared absorbing agent and the acid generating agent, and heat treatment which follows cross-links the resol resin by action of the acid. When the resulting material is developed with an alkali developer, the unexposed portions having higher alkali solubility are removed with an alkali developer, while the exposed portions (cross-linked portions) lose alkali solubility and imagewise remain to form an image. This system requires heat treatment which heats at 140 to 200° C. for 50 to 120 seconds for accelerating the cross-linking reaction at exposed portions, and has problems in energy consumption and processing time.

Japanese Patent O.P.I. Publication No. 2001-175006 discloses a process comprising the step of (a) imagewise exposing to infrared laser a negative-working image formation material comprising an image recording layer containing an infrared absorbing dye, a radical generating agent, a radically polymerizable compound, and a binder polymer, and (b) then heating the resulting material at 60 to 120° C. for 1 to 20 seconds, wherein heating treatment is carried out after exposure. This process, although it conducts heat treatment at relatively low temperature for relatively short time, improves printing durability. However, the heat treatment is required, and a printing plate material obtained by the process does not provide satisfactory printing durability.

In order to increase efficiency in a plate-making process for preparing a printing plate, a planographic printing plate material with high sensitivity has been sought. Japanese Patent Publication No. 2002-537419 discloses a planographic printing plate material comprising an image recording layer containing a specific polycarboxylic acid. This planographic printing plate material provides high sensitivity without lowering storage stability, but still requires heat treatment at 90° C. for about 60 seconds.

Japanese Patent O.P.I. Publication Nos. 2002-278057 and 2003-5363 disclose a printing plate material comprising a specific cyanine dye as an infrared absorbing agent, in which polymerization efficiency is increased and printing durability is increased without heating. This material provides a certain effect but needs to be improved in printing durability.

A printing plate material comprising a specific onium salt as a radical generating agent is disclosed (see for example, Japanese Patent O.P.I. Publication Nos. 2002-341519 and 2003-76010) in which polymerization efficiency is increased and printing durability is increased without heating. This material also provides a certain effect but needs to be improved in printing durability.

SUMMARY OF THE INVENTION

An object of the invention is to provide a planographic printing plate material with high sensitivity giving high printing durability, which does not require heat treatment after exposure, and to provide a process of preparing a planographic printing plate with high printing durability from the planographic printing plate material.

DETAILED DESCRIPTION OF THE INVENTION

The above object has been attained by one of the following constitutions:

1. A planographic printing plate material comprising a support and provided thereon, an image formation layer containing a colorant (a) having an absorption band in a wavelength region of from 700 to 1200 nm, a polymerization initiator (b) and a polymerizable ethylenically unsaturated compound (c), wherein the polymerization initiator (b) is a compound represented by the following formula (1), $$R^1-CX_2-(C=O)-R^2 \qquad \text{Formula (1)}$$

wherein $R^1$ represents a hydrogen atom, a bromine atom, a chlorine atom, an alkyl group, an aryl group, an acyl group, an alkylsulfonyl group, an arylsulfonyl group, an iminosulfonyl group, or a cyano group; $R^2$ represents a hydrogen atom or a first monovalent organic substituent, provided that $R^1$ and $R^2$ may combine with each other to form a ring; and X represents a bromine atom or a chlorine atom.

2. The planographic printing plate material of claim 1, wherein $R^2$ represents $-(Y)-R^3$ in which Y represents an oxygen atom or $-NR^4-$ in which $R^4$ represents a hydrogen atom or an alkyl group, and $R^3$ represents a hydrogen atom or a second monovalent organic substituent.

3. The planographic printing plate material of item 1 above, wherein $R^1$ in formula (1) is a hydrogen atom, a bromine atom, or a chlorine atom.

4. The planographic printing plate material of item 1 above, wherein the colorant is a cyanine dye.

5. The planographic printing plate material of item 1 above, wherein the colorant is carbon black.

6. The planographic printing plate material of item 1 above, wherein the image formation layer further comprises at least one selected from the group consisting of a sulfonium salt, a iodonium salt, an iron-arene compound and a titanocene compound.

7. The planographic printing plate material of item 1 above, wherein the polymerizable ethylenically unsaturated compound is a compound having a urethane bond in the molecule.

8. The planographic printing plate material item 1 above, wherein an overcoat layer containing polyvinyl alcohol as the main component is provided on the image formation layer.

9. A process of preparing a planographic printing plate, the process comprising the steps of imagewise exposing the planographic printing plate material of item 1 above to laser having an emission wavelength of from 700 to 1200 nm, and developing the exposed planographic printing plate material with an alkali developer.

10. A process of preparing a planographic printing plate, the process comprising the steps of imagewise exposing the planographic printing plate material of item 8 above to laser having an emission wavelength of from 700 to 1200 nm, washing the exposed planographic printing plate material with water to remove the overcoat layer, and developing the washed planographic printing plate material with an alkali developer.

Next, the present invention will be explained in detail.

(Colorant (a) Having an Absorption Band in a Wavelength Region of From 700 to 1200 nm)

The colorant (a) in the invention is a colorant (a) having an absorption band in a wavelength region of from 700 to 1200 nm. The colorant is not specifically limited, but as the colorants (a) in the invention, there are infrared absorbing agents, light-to-heat conversion materials, near infrared dyes, or pigments disclosed in U.S. Pat. No. 5,340,699, Japanese Patent O.P.I. Publication No. 2001-175006, Japanese Patent Publication No. 2002-537419, and Japanese Patent O.P.I. Publication Nos. 2002-341519, 2003-76010, 2002-278057, 2003-5363, 2001-125260, 2002-23360, 2002-40638, 2002-62642, and 2002-2787057.

As the colorants in the invention, dyes such as cyanine dyes, squalirium dyes, oxonol dyes, pyrylium dyes, thiopyrylium dyes, polymethine dyes, oil soluble phthalocyanine dyes, triarylamine dyes, thiazolium dyes, oxazolium dyes, polyaniline dyes, polypyrrole dyes and polythiophene dyes can be preferably used.

Besides the above, pigments such as carbon black, titanium black, iron oxide powder, and colloidal silver can be preferably used. Cyanine dyes as dyes, and carbon black as pigments are especially preferred, in view of extinction coefficient, light-to-heat conversion efficiency and cost.

Preferred examples of the cyanine dyes will be listed below.

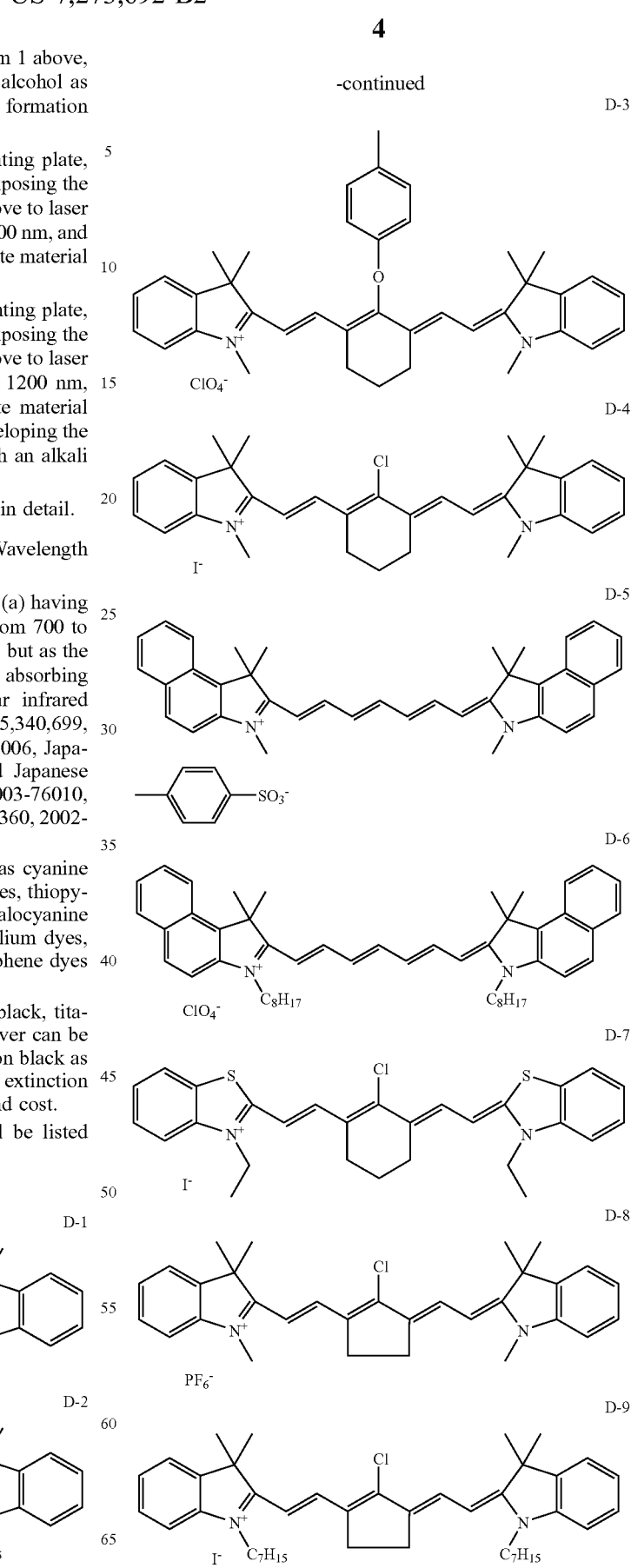

D-10
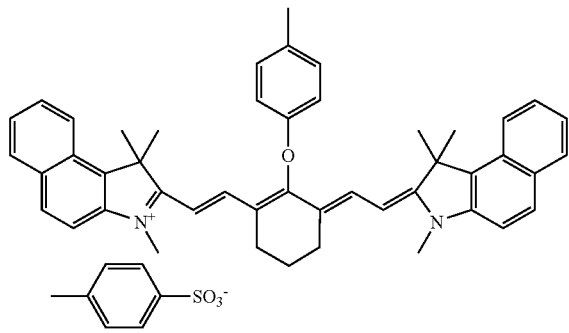
D-11
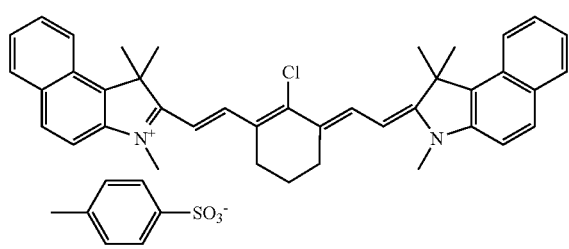
D-12
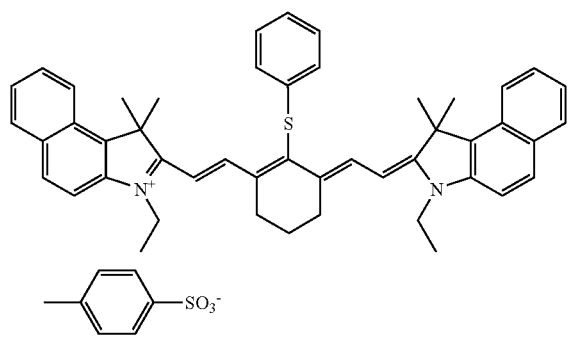
D-13
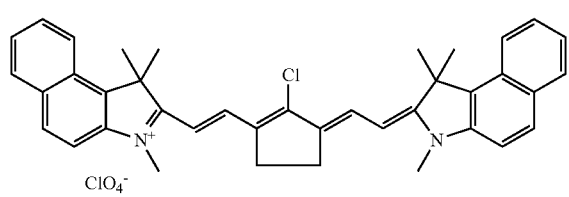
D-14
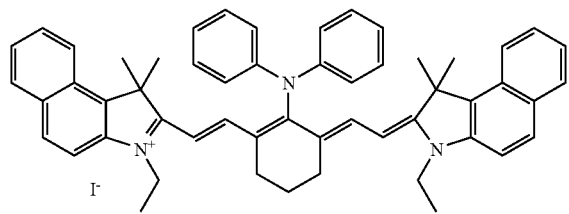
D-15
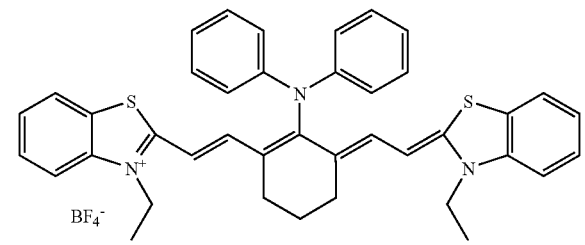
D-16
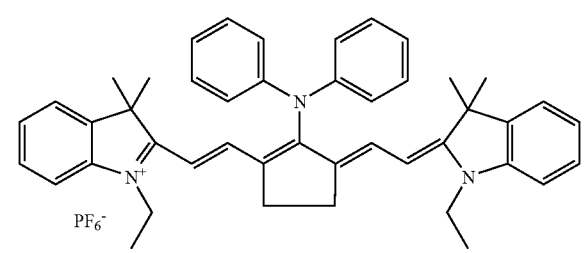
D-17
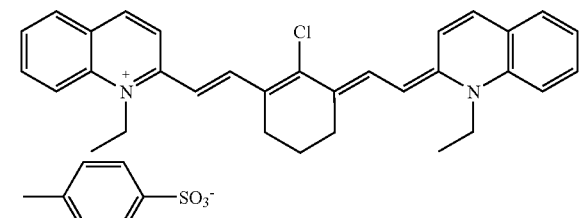
D-18
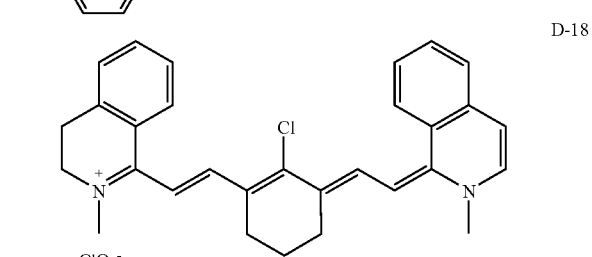
D-19
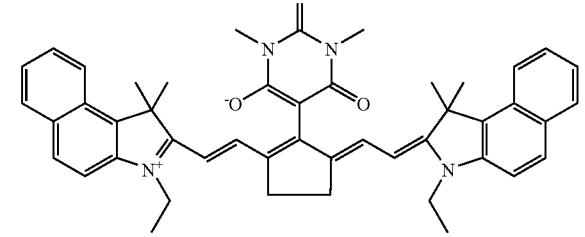
D-20
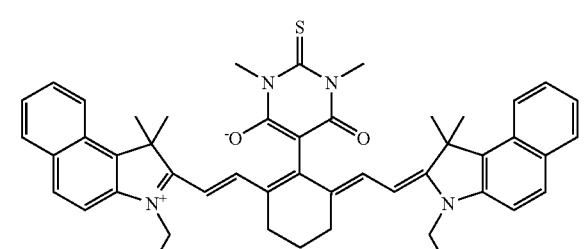

The content of the colorant having an absorption band in a wavelength region of from 700 to 1200 nm in the image formation layer is different due to extinction coefficient of the colorant, but is preferably an amount giving a reflection density of from 0.3 to 3.0, and preferably from 0.5 to 2.0. For example, in order to obtain the above reflection density, the content of the cyanine dye in the image formation layer is 10 to 100 mg/m$^2$.

Polymerization Initiator (b)

The polymerization initiator in the invention is a compound represented by formula (1) above.

In formula (1), $R^1$ represents a hydrogen atom, a chlorine atom, a bromine atom, an alkyl group, an aryl group, an acyl group, an alkylsulfonyl group, an arylsulfonyl group, an iminosulfonyl group or a cyano group; $R^2$ represents a hydrogen atom or a monovalent substituent, provided that $R^1$ and $R^2$ may combine with each other to form a ring; and X represents a chlorine atom or a bromine atom.

In formula (1), $R^1$ is preferably a hydrogen atom, a chlorine atom, or a bromine atom, in view of sensitivity.

The monovalent substituent represented by $R^2$ is not specifically limited, as long as the compound of formula (1) generates a radical on light irradiation, but $R^2$ is preferably an alkyl group having a carbon atom number of from 1 to 30, a cycloalkyl group, an alkenyl group, an aryl group, a heterocyclic group, an aminocarbonyl group, or —(Y)—$R^3$ in which Y represents an oxygen atom or —$NR^4$— in which $R^4$ represents a hydrogen atom or an alkyl group, and $R^3$ represents a hydrogen atom or a monovalent organic substituent. The alkyl group, cycloalkyl group, alkenyl group, aryl group, or heterocyclic group of $R^2$ can have, as a substituent, an alkyl group, a cycloalkyl group, an alkenyl group, an aryl group, a heterocyclic group, an alkoxy group, an alkylthio group, an alkoxyalkyl group, an aryloxyalkyl group, an alkylthioalkyl group, an acyl group, an acyloxy group, an alkoxycarbonyl group, an aminocarbonyl group, a hydroxyl group, a carboxyl group, an alkylamino group or a dialkylamino group. The monovalent organic substituent of $R^3$ is the same as those denoted in $R^2$ above. $R^2$ is more preferably —(Y)—$R^3$ described above. In this case also, $R^1$ is preferably a hydrogen atom, a chlorine atom, or a bromine atom, in view of sensitivity.

Of these compounds, a compound having at least one haloacetyl group selected from a tribromoacetyl group, a dibromoacetyl group, a trichloroacetyl group, and a dichloroacetyl group is preferred. In view of synthesis, a compound having at least one haloacetoxy group selected from a tribromoacetoxy group, a dibromoacetoxy group, a trichloroacetoxy group, and a dichloroacetoxy group, which is obtained by reacting a monohydric or polyhydric alcohol with a corresponding acid chloride, or a compound having at least one haloacetylamino group selected from a tribromoacetylamino group, a dibromoacetylamino group, a trichloroacetylamino group, and a dichloroacetylamino group, which is obtained by reacting a primary monoamine or primary polyamine with a corresponding acid chloride is especially preferred. Compounds having two or more of each of the haloacetyl group, haloacetoxy group, and haloacetylamino group are preferably used.

These compounds can be easily synthesized by conventional esterification or amidation.

Typical synthesis method of the photopolymerization initiator represented by formula (1) is one in which alcohols, phenols or amines are esterified or amidated with acid chlorides such as tribromoacetic acid chloride, diibromoacetic acid chloride, trichlorooacetic acid chloride, or dichloroacetic acid chloride.

The alcohols, phenols or amines used above are arbitrary, and examples thereof include monohydric alcohols such as ethanol, 2-butanol, and 1-adamantanol; polyhydric alcohols such as diethylene glycol, trimethylol propane, and dipentaerythritol; phenols such as phenol, pyrogallol, and naphthol; monoamines such as morpholine, aniline, and 1-aminodecane; and polyamines such as 2,2-dimethylpropylenediamine, and 1,12-dodecanediamine.

Preferred exemplified compounds of the polymerization initiator in the invention will be listed below.

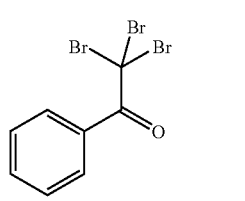

BR1

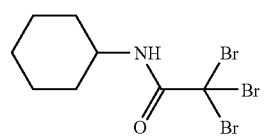

BR2

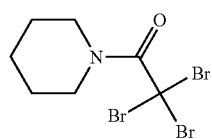

BR3

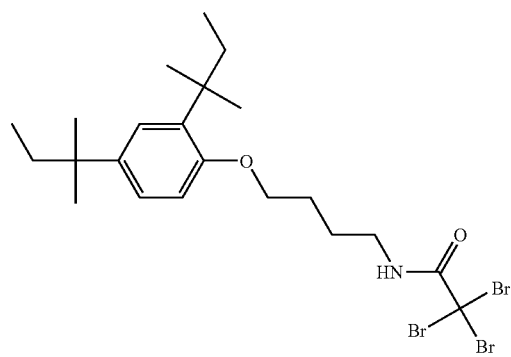

BR4

-continued
BR5 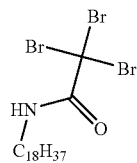 BR6 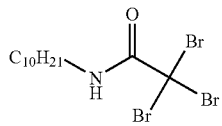
BR7 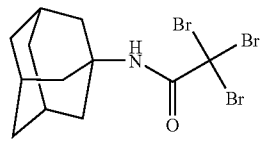 BR8 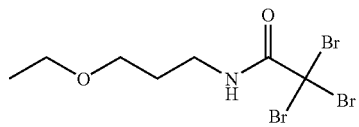
BR9 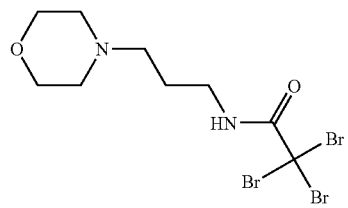 BR10 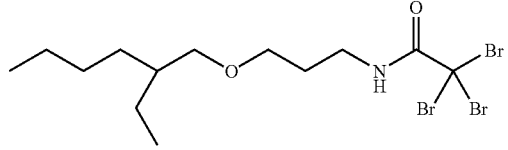
BR11 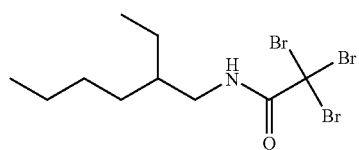 BR12 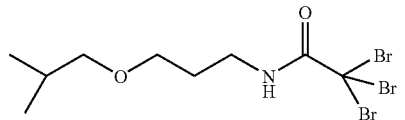
BR13 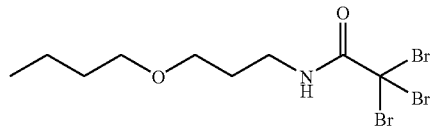 BR14 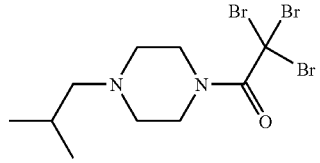
BR15 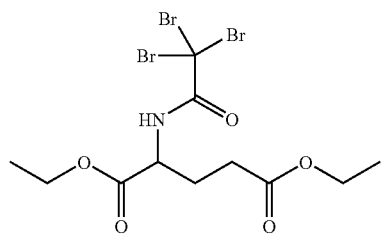 BR16 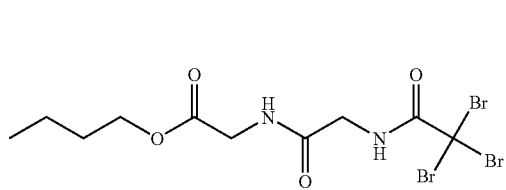
BR17 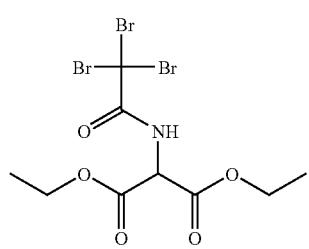 BR18 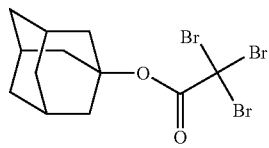
BR19 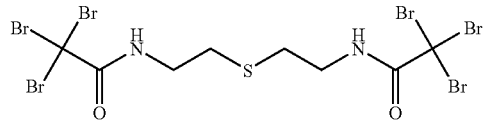 BR20 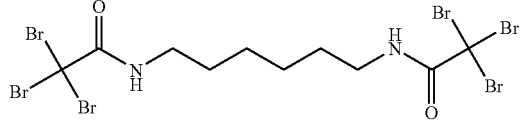

-continued
BR21
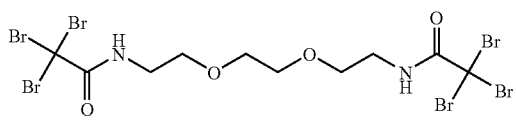
BR22
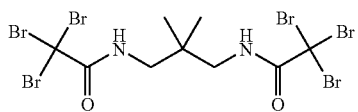
BR23
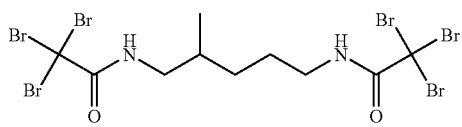
BR24
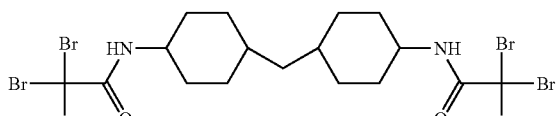
BR25
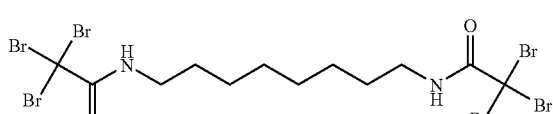
BR26
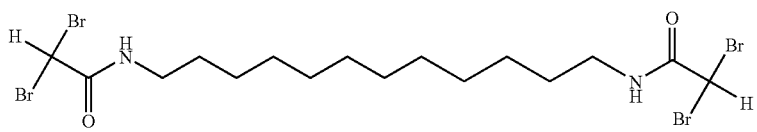
BR27
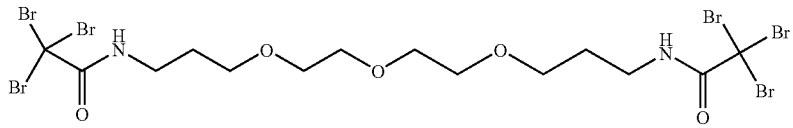
BR28
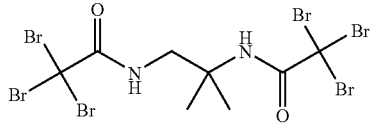
BR29
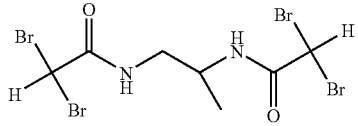
BR30
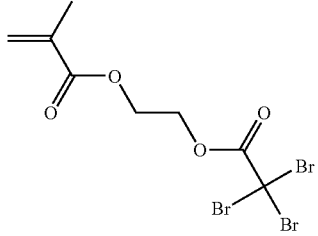
BR31
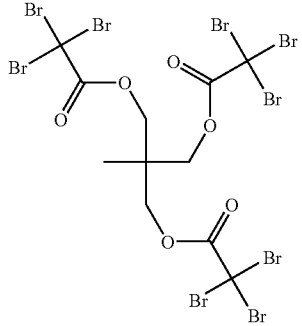
BR32
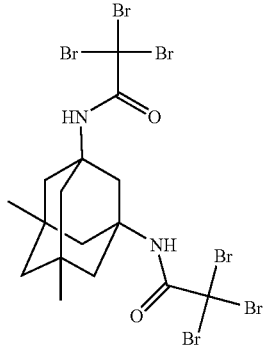
BR33
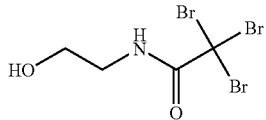

-continued
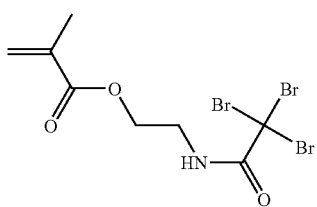
BR34
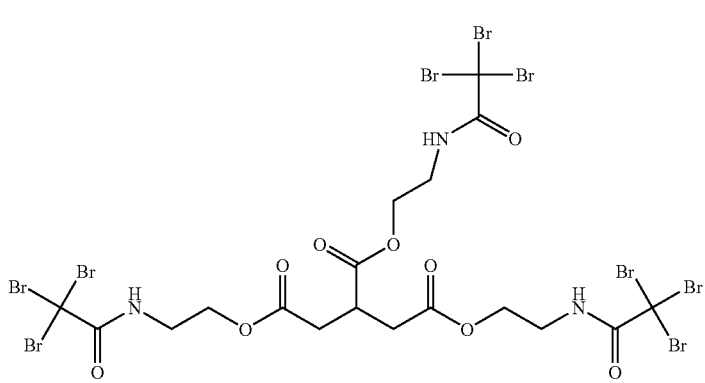
BR35
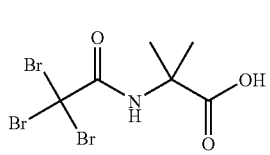
BR36
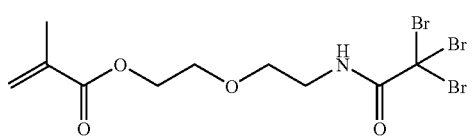
BR37
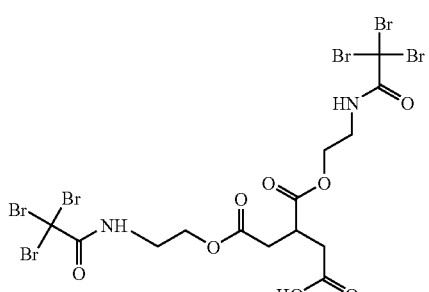
BR38
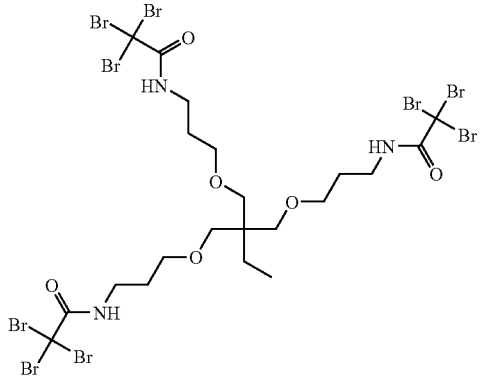
BR39
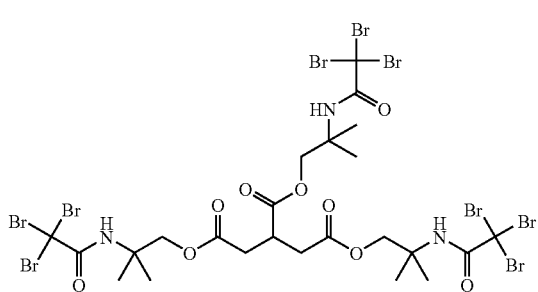
BR40
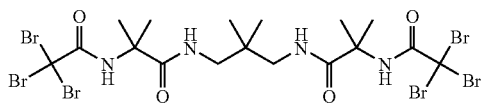
BR41

BR42
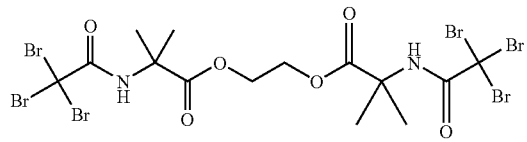
BR43
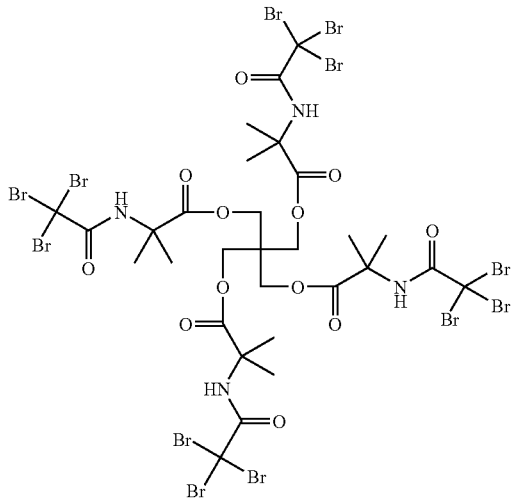
BR44
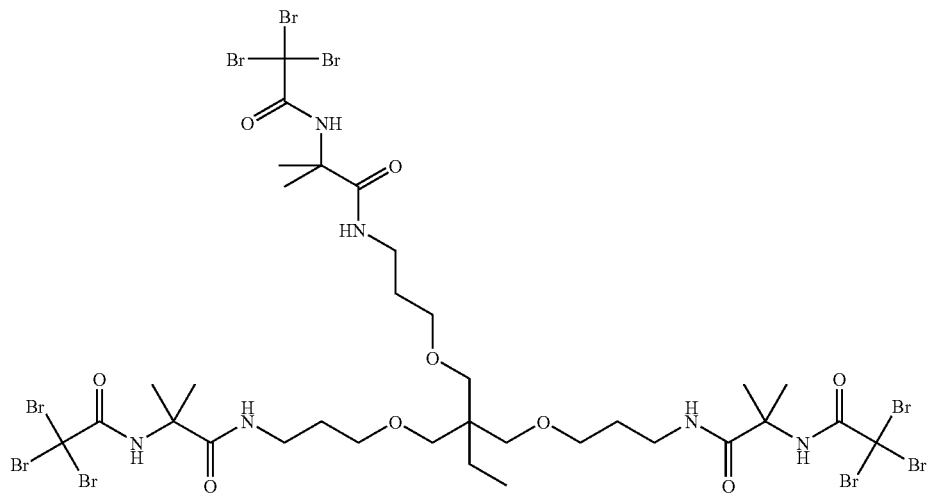
BR45
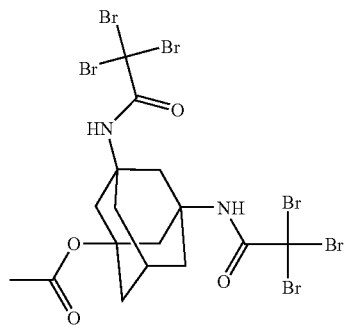
BR46
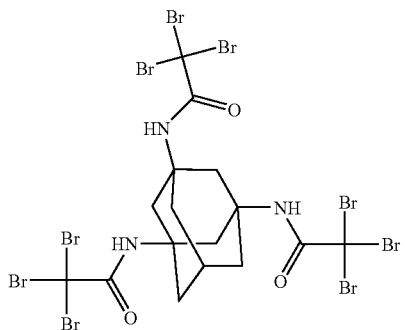
BR47
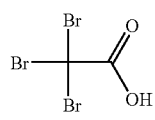
BR48
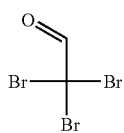

-continued
BR49 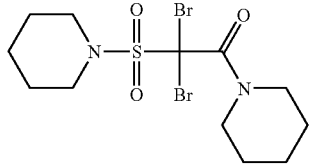 BR50
BR51 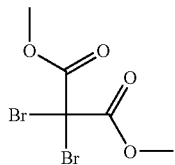 BR52
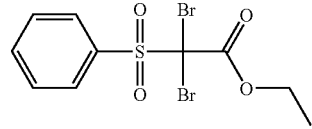
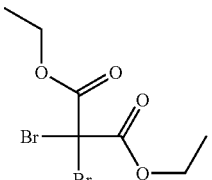
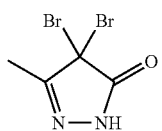
BR53 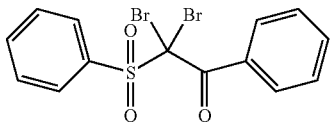 BR54
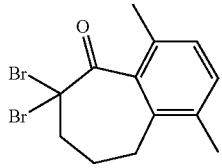
BR55 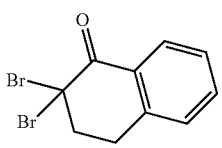 BR56
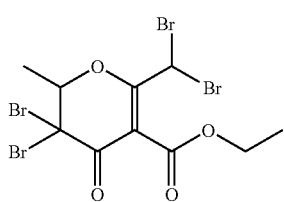
BR57 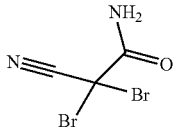 BR58
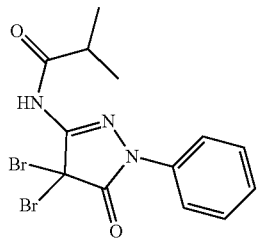
BR59 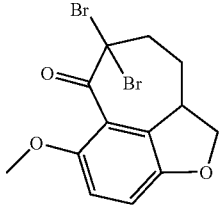 BR60
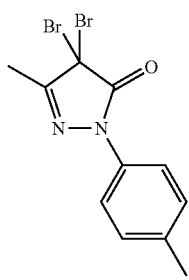
BR61 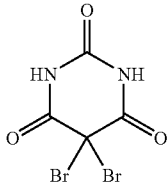 BR62
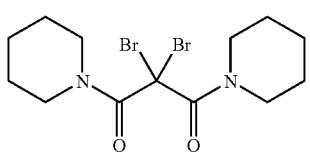
BR63 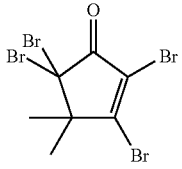 BR64

-continued
| | |
|---|---|
| BR65 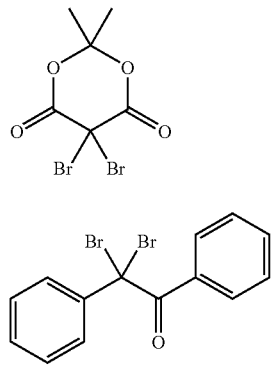 | BR66 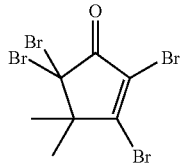 |
| BR67 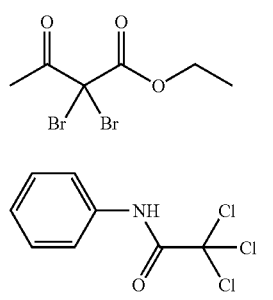 | BR68 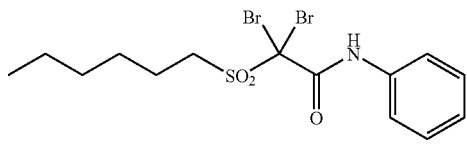 |
| BR69 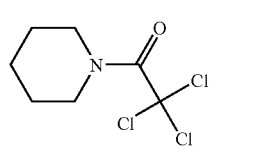 | BR70 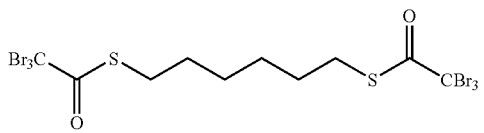 |
| CL1 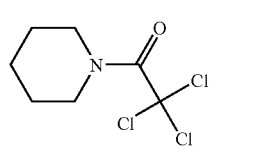 | CL2 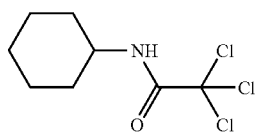 |
| CL3 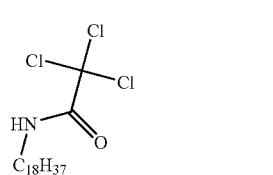 | CL4 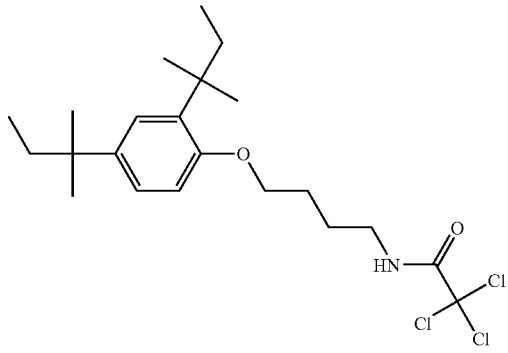 |
| CL5 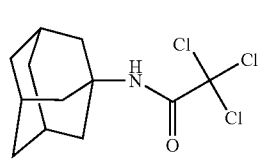 | CL6 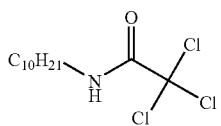 |
| CL7 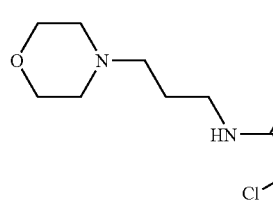 | CL8 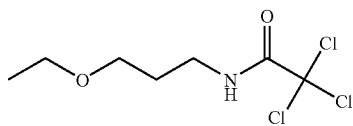 |
| CL9 | CL10 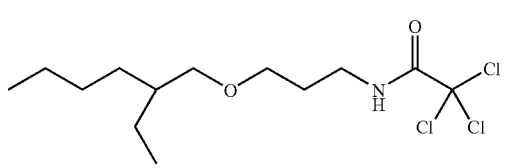 |

-continued
CL11 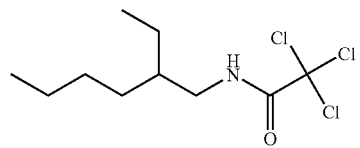
CL12 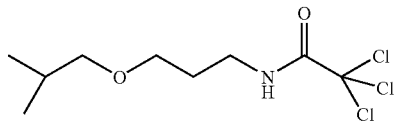
CL13 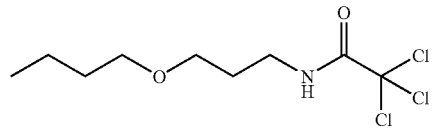
CL14 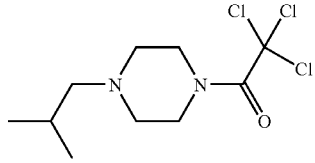
CL15 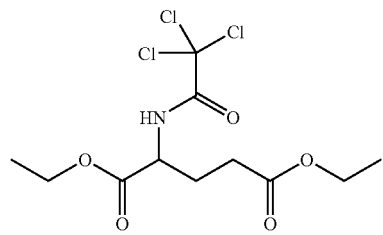
CL16 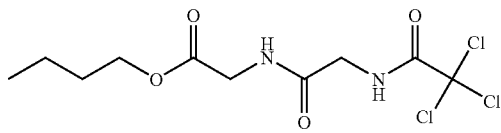
CL17 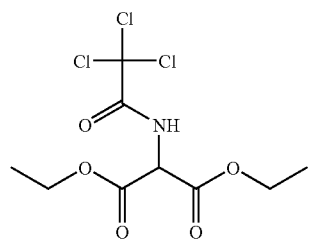
CL18 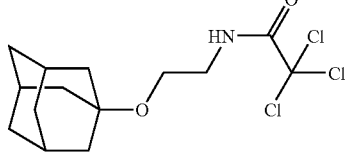
CL19 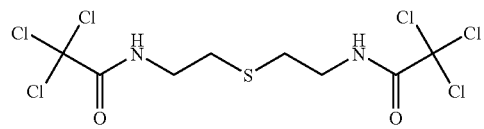
CL20 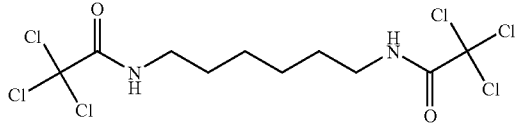
CL21 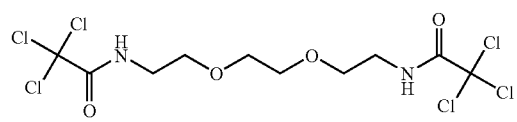
CL22 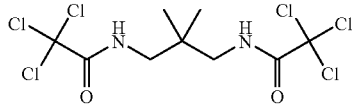
CL23 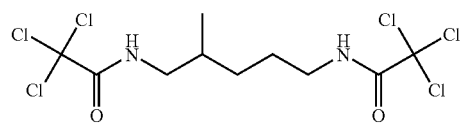
CL24 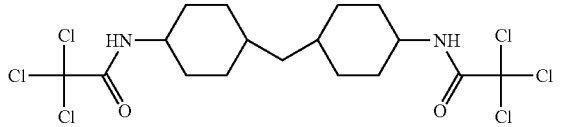
CL25 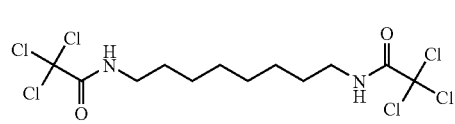
CL26 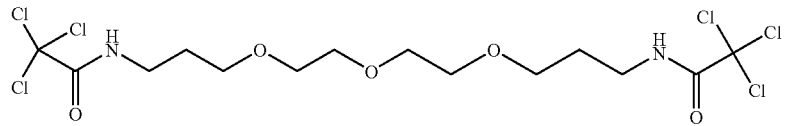
CL27 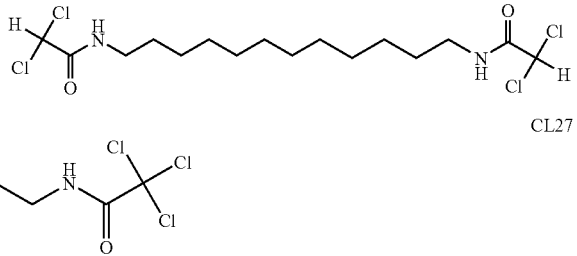

-continued
CL28
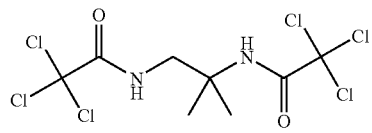
CL29
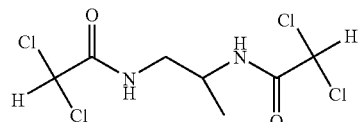
CL30
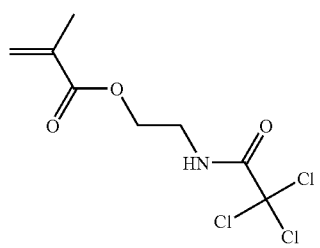
CL31
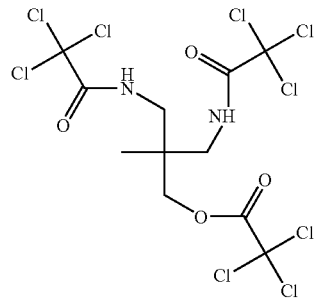
CL32
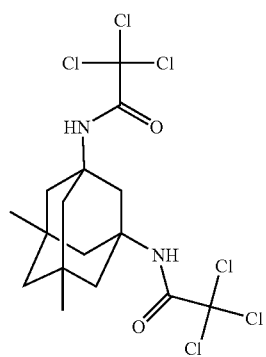
CL33
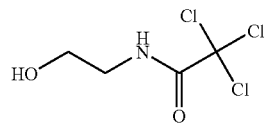
CL34
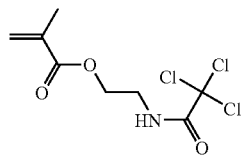
CL35
CL36
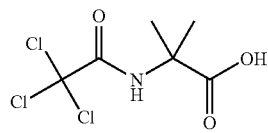
CL37
CL38
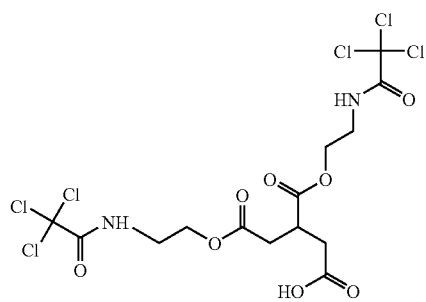
CL39
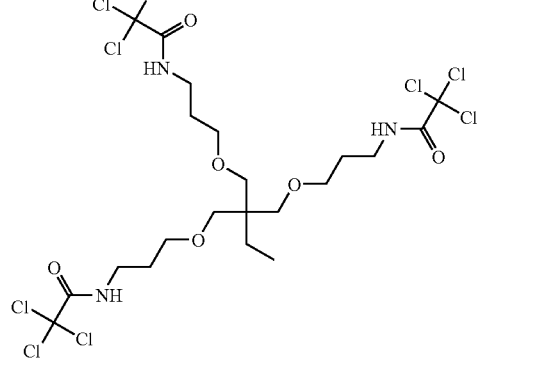

-continued
CL40
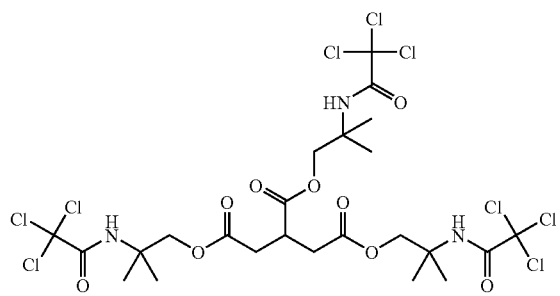
CL41
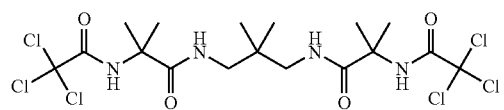
CL42
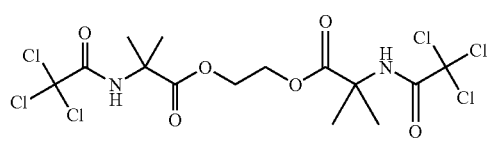
CL43
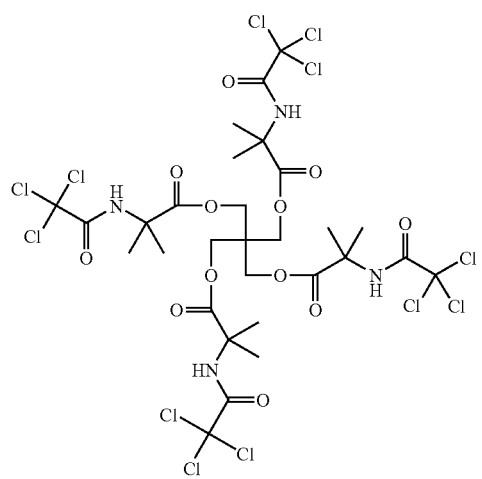
CL44
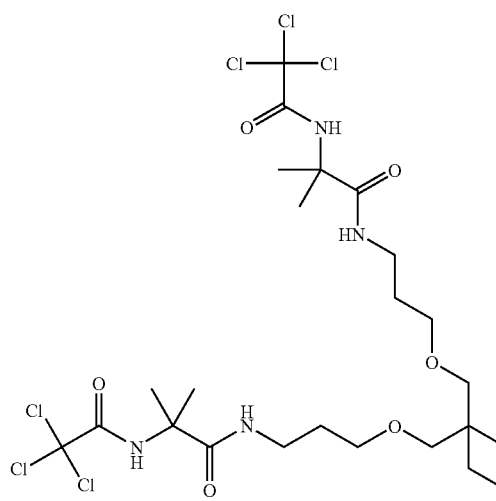
CL45
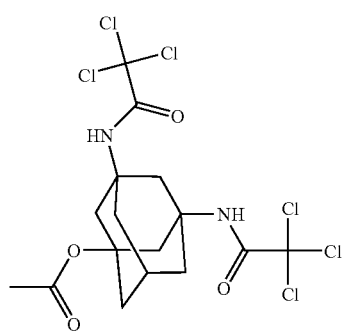
CL46
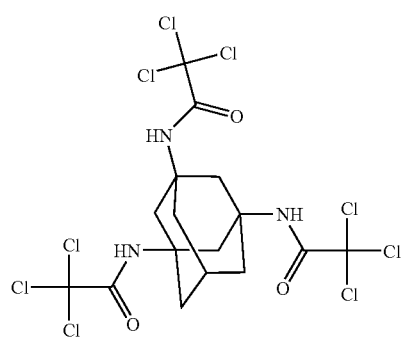

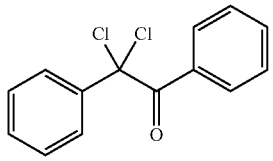 CL47

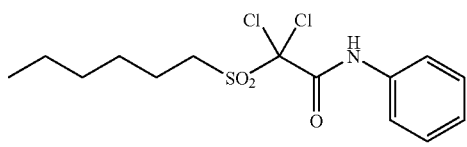 CL48

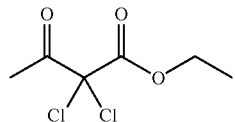 CL49

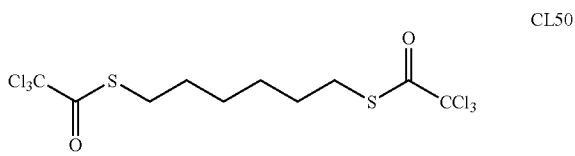 CL50

The content of the compound of formula (1) (the polymerization initiator in the invention) in the image formation layer is not specifically limited, but is preferably from 0.1 to 20% by weight, and more preferably from 0.8 to 15% by weight. In the invention, a polymerization initiator other than the polymerization initiator in the invention can be used together with the compound of formula (1).

Examples of the polymerization initiator other than the polymerization initiator in the invention include radical generating compounds disclosed in Japanese Patent Publication No. 2002-537419, polymerization initiators disclosed in Japanese Patent O.P.I. Publication Nos. 2001-175006, 2002-278057, and 2003-5363, onium salts having two or more cation portions in the molecule disclosed in Japanese Patent O.P.I. Publication No. 2003-76010, N-nitroso amine compounds disclosed in Japanese Patent O.P.I. Publication No. 2001-133966, thermally radical generating compounds disclosed in Japanese Patent O.P.I. Publication No. 2001-343742, compounds of generating a radical or an acid by heat disclosed in Japanese Patent O.P.I. Publication No. 2002-6482, borate compounds disclosed in Japanese Patent O.P.I. Publication No. 2002-116539, compounds of generating a radical or an acid by heat disclosed in Japanese Patent O.P.I. Publication No. 2002-148790, photopolymerization initiators or thermal polymerization initiators each having a polymerizable unsaturated group disclosed in Japanese Patent O.P.I. Publication No. 2002-207293, onium salts having, as a counter ion, a divalent or more valent anion disclosed in Japanese Patent O.P.I. Publication No. 2002-268217, sulfonylsulfone compounds having a specific structure disclosed in Japanese Patent O.P.I. Publication No. 2002-328465 and thermally radical generating compounds disclosed in Japanese Patent O.P.I. Publication No. 2002-341519.

The polymerization initiator other than the polymerization initiator in the invention is preferably a sulfonium salt, a iodonium salt, a titanocene compound, an iron-arene compound, a trihalomethyltriazine compound, a bisimidazole compound, an acylphosphine oxide compound, a benzoin derivative, or an N-phenylglycine derivative, and more preferably a sulfonium salt, a iodonium salt, a titanocene compound, or an iron-arene compound. Exemplified compounds of the polymerization initiator other than the polymerization initiator in the invention will be listed below.

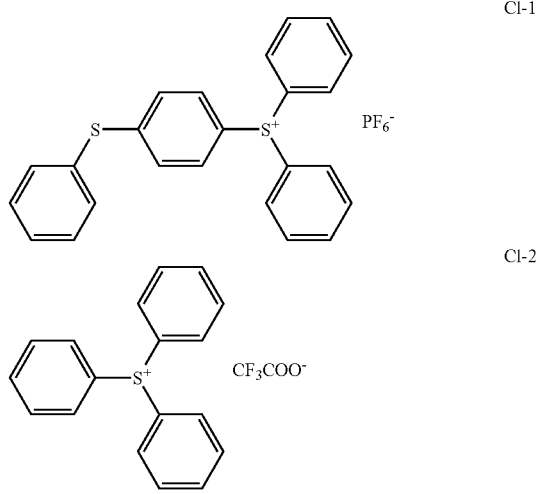

Cl-1

Cl-2

Cl-3

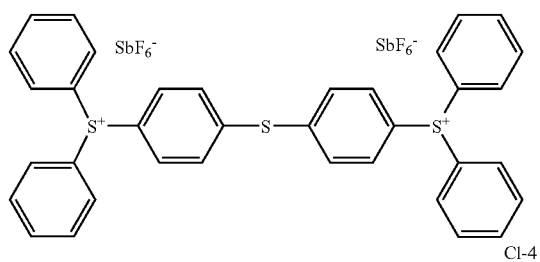

Cl-4

Cl-5

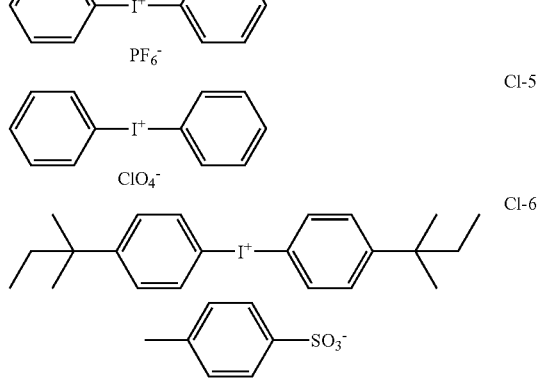

Cl-6

-continued
Cl-7
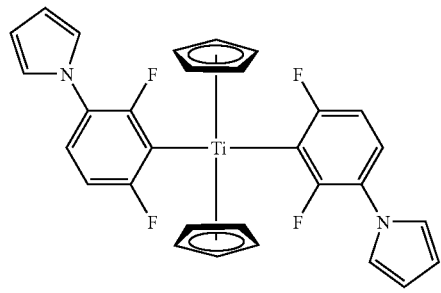
Cl-8
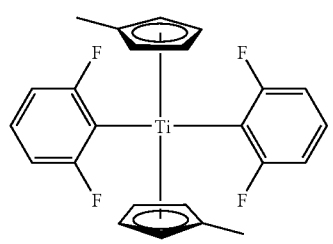
Cl-9
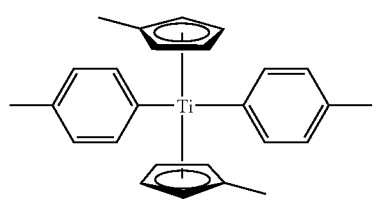
Cl-10
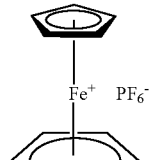
Cl-11
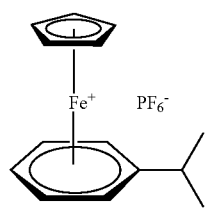
Cl-12
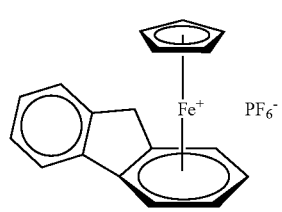
Cl-13
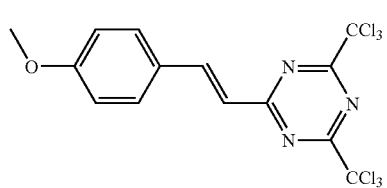
-continued
Cl-14
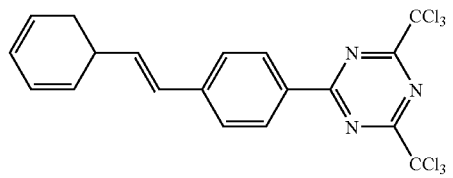
Cl-15
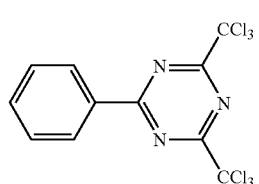
Cl-16
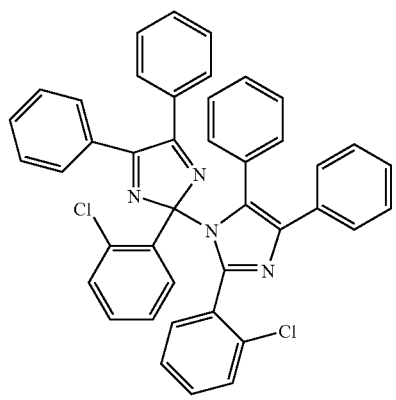
Cl-17
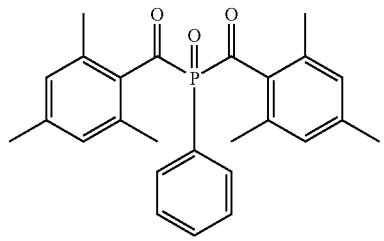
Cl-18
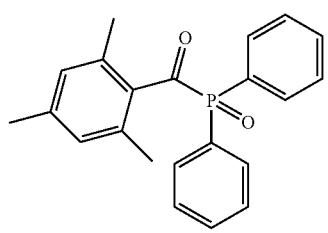
Cl-19
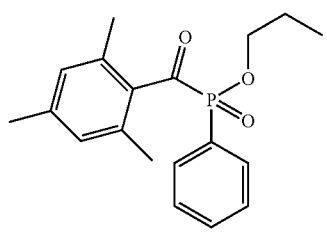

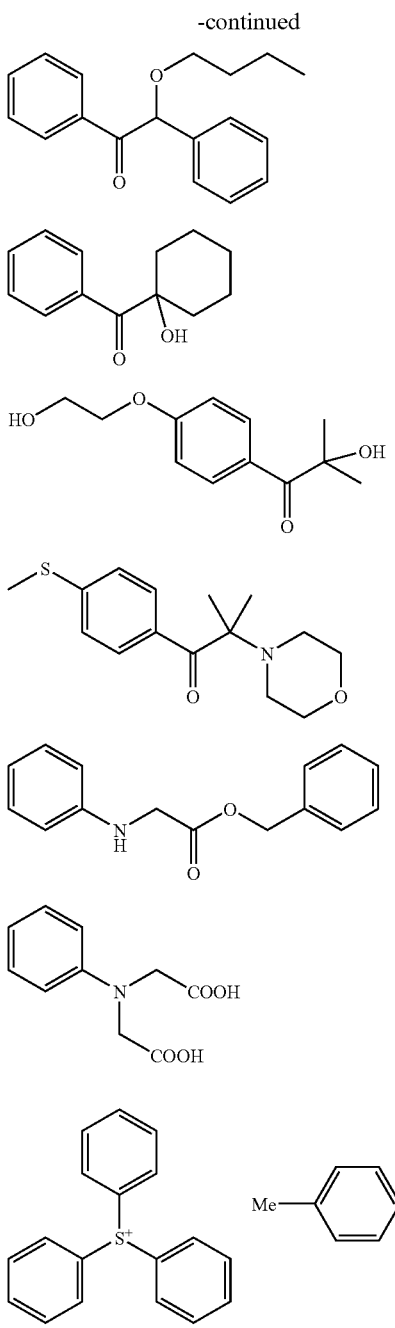

The content of the polymerization initiator other than the polymerization initiator in the invention in the image formation layer is not specifically limited, but is preferably from 0.1 to 20% by weight, and more preferably from 0.8 to 15% by weight.

(Polymerizable Ethylenically Unsaturated Compound (c))

In the invention, the polymerizable ethylenically unsaturated compound is a compound having an ethylenically unsaturated bond in the molecule, and as the polymerizable ethylenically unsaturated compound, there are a conventional radical polymerizable monomer, and a polyfunctional monomer or oligomer having two or more of an ethylenic double bond in the molecule as generally used in an ultraviolet curable resin composition.

The image formation layer contains the polymerizable ethylenically unsaturated compound in an amount of preferably 10 to 80% by weight, and more preferably 20 to 60% by weight.

These polymerizable ethylenically unsaturated compounds are not specifically limited. Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate -ε-caprolactone adduct, pyrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

Prepolymers can be used, and the prepolymers can be used singly, in combination, or as an admixture thereof with the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A•epichlorhydrin•(meth)acrylic acid or phenol novolak•epichlorhydrin•(meth)acrylic acid obtained by incorporating (meth)acrylic acid in an epoxy resin; an urethaneacrylate such as ethylene glycol•adipic acid•tolylenediisocyanate•2-hydroxyethylacrylate, polyethylene glycol•tolylenediisocyanate•2-hydroxyethylacrylate, hydroxyethylphthalyl methacrylate•xylenediisocyanate, 1,2-polybutadieneglycol•tolylenediisocyanate•2-hydroxyethylacrylate or trimethylolpropane•propylene glycol•tolylenediisocyanate•2-hydroxyethylacrylate, obtained by incorporating (meth)acrylic acid in an urethane resin; a silicone acrylate such as polysiloxane acrylate, or polysiloxane•diisocyanate•2-hydroxyethylacrylate; an alkyd modified acrylate obtained by incorporating a methacroyl group in an oil modified alkyd resin; and a spirant resin acrylate.

The image formation layer in the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

In the invention, among these, compounds having a urethane bond are preferably used.

The ethylenic monomer used in the invention is a phosphate compound having at least one (meth)acryloyl group. The phosphate compound is a compound having a (meth)acryloyl group in which at least one hydroxyl group of phosphoric acid is esterified.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV•EB Koka Handbook (Materials)" edited by Kobunshi Kankokai can be suitably used. Of these compounds, compounds having two or more acryl or methacryl groups in the molecule are preferable, and those having a molecular weight of not more than 10,000; and preferably not more than 5,000 are more preferable.

In the invention, an addition polymerizable ethylenically unsaturated monomer having a tertiary amino group in the molecule is preferably used. Its molecular structure is not limited, but those in which a tertiary amine having a hydroxyl group is modified with glycidyl methacrylate, methacrylic chloride, or acrylic chloride. Examples thereof include a polymerizable compound disclosed I Japanese Patent O.P.I. Publication Nos. 1-165613, 1-203413 and 1-197213.

A reaction product of a polyhydric alcohol having a tertiary amino group in the molecule, a diisocyanate and a compound having a hydroxyl group and an addition polymerizable ethylenically double bond in the molecule is preferably used in the invention.

Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N', N'-tetra-2-hydroxypropylethylenediamine, p-tolyldiethanolamine, N,N,N',N'-tetra-2-hydroxyethylenediamine, N,N-bis(2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto.

Examples of the compound having a hydroxyl group and an addition polymerizable ethylenically double bond in the molecule include compounds MH-1 through MH-13 as described later. Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

The chemical structure of MH-1 through MH-13 will be shown below.

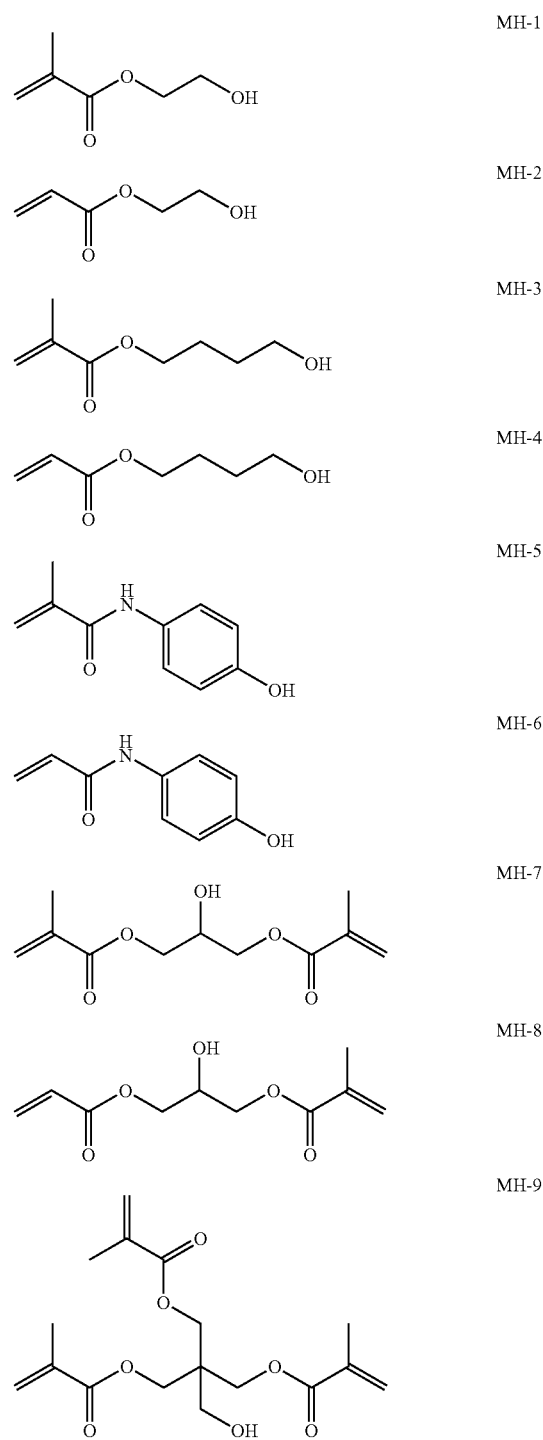

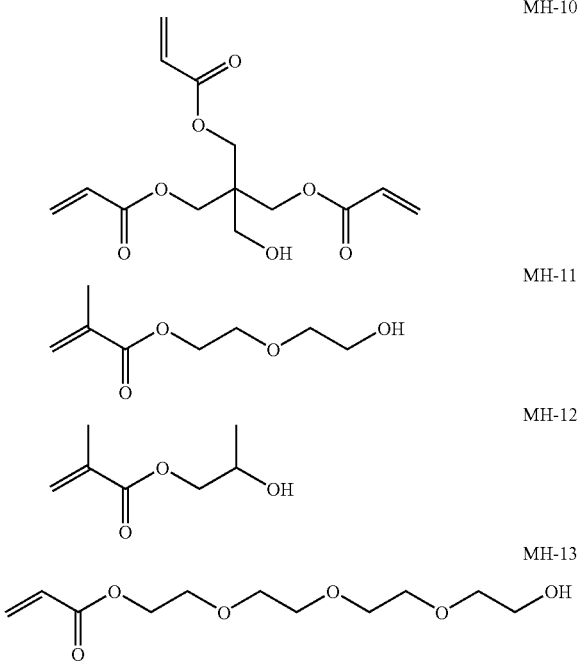

The reaction product above can be synthesized according to the same method as a conventional method in which a urethaneacrylate compound is ordinarily synthesized employing an ordinary diol, a diisocyanate and an acrylate having a hydroxyl group.

Examples of the reaction product of a polyhydric alcohol having a tertiary amino group in the molecule, a diisocyanate and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

M-6: A reaction product of triethanolamine (1 mole), 1,3-bis (1-cyanato-1-methylethyl)benzene (3 moles), and 2-hydroxyethyl methacrylate (3 moles)

M-7: A reaction product of ethylenediamine tetraethanol (1 mole), 1,3-bis (1-cyanato-1-methylethyl)benzene (4 moles), and 2-hydroxyethyl methacrylate (4 moles)

In addition to the above, acrylates or methacrylates disclosed in Japanese Patent O.P.I. Publication Nos. 1-105238 and 2-127404 can be used.

Polymer Binder

The image formation layer of the planographic printing plate material in the invention can contain a polymer binder for carrying other components in the image formation layer.

As the polymer binder in the invention can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

The polymer binder used in the invention is preferably a vinyl copolymer obtained by copolymerization of an acryl monomer, and more preferably a copolymer containing (i) a carboxyl group-containing monomer unit and (ii) an alkyl methacrylate or alkyl acrylate unit as the copolymerization component.

Examples of the carboxyl group-containing monomer include an α, β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

1) A monomer having an aromatic hydroxy group, for example, o-, (p- or m-) hydroxystyrene, or o-, (p- or m-) hydroxyphenylacrylate;

2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

4) A monomer having a sulfonamido group, for example, N-(p-toluenesulfonyl)acrylamide, or N-(p-toluenesulfonyl)-methacrylamide;

5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl -N-(2-acryloxyethyl) heptadecafluorooctylsulfonamide;

7) A vinyl ether, for example, ethyl vinyl ether, 2-chloroethyl vinyl ether, propyl vinyl ether, butyl vinyl ether, octyl vinyl ether, or phenyl vinyl ether;

8) A vinyl ester, for example, vinyl acetate, vinyl chloroacetates, vinyl butyrate, or vinyl benzoate;

9) A styrene, for example, styrene, methylstyrene, or chloromethystyrene;

10) A vinyl ketone, for example, methyl vinyl ketone, ethyl vinyl ketone, propyl vinyl ketone, or phenyl vinyl ketone;

11) An olefin, for example, ethylene, propylene, isobutylene, butadiene, or isoprene;

12) N-vinylpyrrolidone, N-vinylcarbazole, or N-vinylpyridine,

13) A monomer having a cyano group, for example, acrylonitrile, methacrylonitrile, 2-pentenenitrile, 2-methyl -3-butene nitrile, 2-cyanoethyl acrylate, or o-, m- or p-cyanostyrene;

14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer.

As the polymer binder is also preferred an unsaturated bond-containing copolymer which is obtained by reacting a carboxyl group contained in the above vinyl copolymer molecule with for example, a compound having a (meth) acryloyl group and an epoxy group.

Examples of the compound having an unsaturated bond and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC).

The content of the polymer binder in the image formation layer is preferably from 10 to 90% by weight, more preferably from 15 to 70% by weight, and still more preferably from 20 to 50% by weight, in view of sensitivity.

The acid value of the polymer binder is preferably from 10 to 150, more preferably from 30 to 120, and still more preferably from 50 to 90, in view of balance of polarity of the image formation layer, which can prevent coagulation of pigment used in the photopolymerizable light sensitive layer coating liquid.

The image formation layer in the invention is preferably added with a polymerization inhibitor, in order to prevent undesired polymerization of the ethylenically unsaturated monomer during the manufacture or after storage of planographic printing plate material. Examples of the polymerization inhibitor include hydroquinone, p-methoxyphenol, di-t-butyl-p-cresol, pyrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthylbenzyl)-4-methylphen acrylate.

The polymerization inhibitor content is preferably 0.01 to 5% by weight based on the total solid content of the light sensitive layer. Further, in order to prevent undesired polymerization induced by oxygen, behenic acid or a higher fatty acid derivative such as behenic amide may be added to the layer. After the light sensitive layer is coated layer, the coated layer may be dried so that the higher fatty acid derivative is localized at the vicinity of the surface of the light sensitive layer. The content of the higher fatty acid derivative is preferably 0.5 to 10% by weight, based on the total solid content of the light sensitive layer.

A colorant can be also used. As the colorant can be used known materials including commercially available materials. Examples of the colorant include those described in revised edition "Ganryo Binran", edited by Nippon Ganryo Gijutu Kyoukai (published by Seibunndou Sinkosha), or "Color Index Binran". Pigment is preferred.

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment). Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

A surfactant may be added to the image formation layer in order to improve coatability of the layer. A preferred surfactant is a fluorine-contained surfactant.

Further, in order to improve physical properties of the cured light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer.

The solvents used in the preparation of the coating liquid for the image formation layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

In the invention, an overcoat layer is preferably provided on the image formation layer. It is preferred that the overcoat layer (oxygen shielding layer) is highly soluble in the developer as described later (generally an alkaline solution). The overcoat layer contains preferably polyvinyl alcohol and more preferably both polyvinyl alcohol and polyvinyl pyrrolidone. Polyvinyl alcohol has the effect of preventing oxygen from transmitting and polyvinyl pyrrolidone has the effect of increasing adhesion between the oxygen shielding layer and the image formation layer.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the planographic printing plate material in the invention, adhesive strength between the overcoat layer and the image formation layer is preferably not less than 35 mN/mm, more preferably not less than 50 mN/mm, and still more preferably not less than 75 mN/mm. Preferred composition of the overcoat layer is disclosed in Japanese Patent Application No. 8-161645.

The overcoat layer may further contain a surfactant or a matting agent. The overcoat layer is formed, coating on the photopolymerizable light sensitive layer a coating solution in which the above overcoat layer composition is dissolved in an appropriate coating solvent, and drying. The main solvent of the coating solution is preferably water or an alcohol solvent such as methanol, ethanol, or isopropanol.

The thickness of the overcoat layer is preferably 0.1 to 5.0 μm, and more preferably 0.5 to 3.0 μm.

The support used in the invention is a plate or a sheet capable of carrying the image formation layer and preferably has a hydrophilic surface on the side on which the image formation layer is to be provided.

As the supports used in the invention, a plate of a metal such as aluminum, stainless steel, chromium or nickel, or a plastic film such as a polyester film, a polyethylene film or a polypropylene film, which is deposited or laminated with the above-described metal can be used. Further, a polyester film, a polyvinyl chloride film or a nylon film whose surface is subjected to hydrophilization treatment can be used. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. In the aluminum plate for the support, the surface is roughened for water retention.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable.

Though there is no restriction for the electrolytic surface roughening method, a method, in which the support is electrolytically surface roughened in an acidic electrolytic solution, is preferred.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m$^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried but. There is no restriction in particular for the method of anodizing treatment used in the invention, and known methods can be used. The anodizing treatment forms an anodization film on the surface of the support.

The support which has been subjected to anodizing treatment is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye; an amine salt; and so on, for hydrophilization treatment. The sol-gel treatment support disclosed in Japanese Patent O.P.I. Publication No. 5-304358, which has a functional group capable of causing addition reaction by radicals as a covalent bond, is suitably used.

In the invention, the image formation layer is formed by preparing a coating liquid for the image formation layer and coating the liquid on the support according to a coating conventional method, and drying, whereby a planographic printing plate material is obtained. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A drying temperature of the coated image formation layer is preferably from 60 to 160° C., more preferably from 80 to 140° C., and still more preferably from 90 to 120° C., in view of fog occurrence at non-image portions.

As light sources for forming an image on the planographic printing plate material in the invention, laser having an emission wavelength in the infrared to near infrared regions can be used.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As the laser, YAG laser or semi-conductor laser is preferably used. In the invention, a laser being capable of emitting light with an emission wavelength from 700 to 1200 nm is preferred in efficiently displaying the effects of the invention.

As a laser scanning method by means of a laser beam, there are a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium.

The method of scanning an outer surface of a cylinder is especially preferred, since the optical system is easily designed and it is possible to reduce the distance between the planographic printing plate material and the light source in efficiently utilizing laser energy.

In the invention, the exposed planographic printing plate material can be subjected to heat treatment before or during development. Such a heat treatment may provide a slight increase in sensitivity and printing durability. However, the heat treatment is not always necessary, since sufficient performances can be obtained without heat treatment.

Regarding heat treatment, there is, for example, a developing machine in which a preheating roller for preheating an exposed planographic printing plate material to a predetermined temperature is arranged upstream a development section where the preheating is carried out before development. The preheating roller is a roller comprised of a pair of rollers, at least one of the pair of the rollers having a heating means within the roller. The roller having a heating means in it is a pipe of a metal with high thermal conductivity such as aluminum or iron, the pipe having a nichrome wire as a heating element. The outside surface of the pipe may be covered with a sheet of a plastic such as polyethylene, polystyrene or Teflon. Details of such a preheating roller can refer to Japanese Patent O.P.I. Publication No. 64-80962. In the invention, it is preferred that the preheating is carried out at 70 to 180° C. for 3 to 120 seconds.

In the invention, the imagewise exposed image formation layer, which are cured are at exposed portions, is developed with an alkali developer, whereby the image formation layer at exposed portions are removed to form an image.

As the alkali developer, a conventional alkali aqueous solution is used. For example, there is an alkali developer containing an inorganic alkali agent such as sodium silicate, potassium silicate, ammonium silicate, sodium secondary phosphate, potassium secondary phosphate, ammonium secondary phosphate; sodium hydrogen carbonate, potassium hydrogen carbonate, ammonium hydrogen carbonate; sodium carbonate, potassium carbonate, ammonium carbonate; sodium borate, potassium borate, lithium borate; sodium hydroxide, potassium hydroxide, and ammonium hydroxide.

The alkali developer can contain organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents can be used singly or as a mixture of two or more thereof. The alkali developer can contain an anionic surfactant, an amphoteric surfactant, or an organic solvent such as alcohol.

In the invention the preferred alkali developer used in the preparation of a printing plate is an aqueous solution having a silicate content of from 1.0 to 4.0% by weight in terms of $SiO_2$ concentration, and having a pH of from 8.5 to 12.5. The aqueous solution can contain another additive. It is preferred that the aqueous solution further contains a surfactant in an amount of from 0.1 to 5.0% by weight.

It is preferred that the overcoat layer of the planographic printing plate material of the invention be washed with water and removed before development.

It is desirable that the planographic printing plate material of the invention is washed with water before processed in an automatic processor, or is processed in an automatic processor in which a pre-washing tank is provided upstream a developing tank.

EXAMPLES

Next, the present invention will be explained in the following examples, but the present Invention is not limited thereto. In the examples, "parts" represents "parts by weight", unless otherwise specified.

(Synthesis of Polymer Binder)

<<Synthesis of Acryl Copolymer 1>>

Thirty parts of methacrylic acid, 50 parts of methyl methacrylate, 20 parts of ethyl methacrylate, 500 parts of isopropyl alcohol, and 3 parts of α,α'-azobisisobutyronitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylbenzylammonium chloride and 25 parts of glycidyl methacrylate were further added to the mixture, and reacted for additional 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis).

(Preparation of Support)

A 0.3 mm thick aluminum plate (material 1050, quality H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 A/dm² in a 0.3 weight % nitric acid solution, desmut at 60° C. for 10 seconds in a 5% sodium hydroxide solution. The desmut aluminum plate was anodized at 25° C. for 1 minute at a current density of 10 A/dm² and at a voltage of 15 V in a 15% sulfuric acid solution, and further subjected to hydrophilization at 75° C. in a 1% polyvinyl phosphonic acid solution. Thus, support 1 was obtained. The center line average surface roughness (Ra) of the support was 0.65 µm.

(Preparation of Planographic Printing Plate Material Sample)

The following image formation layer coating solution 1 was coated on the resulting support through a wire bar, and dried at 95° C. for 1.5 minutes to give an image formation layer having a dry thickness of 1.5 g/m².

| (Image formation layer coating solution 1) | |
|---|---|
| Ethylenically unsaturated monomer M6 (described above) | 20.0 parts |
| Reaction product of hexane-1,6-diisocyanate (1 mol) with 2-hydroxypropylene-1,3-dimethacrylate (2 mol) | 20.0 parts |
| Tetraethylene glycol dimethacrylate | 10.0 parts |
| Polymerization initiator (as shown in Table 1) | amount as shown in Table 1 |
| Cyanine dye D-11 (described above) | 2.5 parts |
| Acryl copolymer 1 | 40.0 parts |
| N-Phenylglycine benzyl ester | 4.0 parts |
| Phthalocyanine pigment (MHI #454 produced by Mikuni Sikisosha) | 6.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (F-178K: produced by Dainippon Ink Co., Ltd.) | 0.5 parts |
| Methyl ethyl ketone | 80 parts |
| Cyclohexanone | 820 parts |

After that, the following oxygen shielding layer (overcoat layer) coating solution 1 was coated on the resulting image formation layer using an applicator, and dried at 75° C. for 1.5 minutes to give an oxygen shielding layer (overcoat layer) with a dry thickness of 1.8 g/m². Thus, a planographic printing plate material sample, having an oxygen shielding layer on an image formation layer, was obtained.

| <<Oxygen shielding layer coating solution 1>> | |
|---|---|
| Polyvinyl alcohol (GL-05, produced by Nippon Gosei Kagaku Co., Ltd.) | 89 parts |
| Water-soluble polyamide (P-70, produced by Toray Co., Ltd.) | 10 parts |
| Surfactant (Surfinol 465, produced by Nisshin Kagaku Kogyo Co., Ltd.) | 0.5 parts |
| Water | 900 parts |

(Evaluation of Planographic Printing Plate Material Sample)

<<Sensitivity>>

(Measurement of Sensitivity)

The planographic printing plate material sample obtained above was imagewise exposed at a resolving degree of 2400 dpi, employing a plate setter (Trend setter produced by Creo Co., Ltd.) equipped with a 830 nm light source). Herein, dpi represents the dot numbers per 2.54 cm. The image pattern used for the exposure comprised a solid image and a square dot image with a screen number of 175 LPI (LPI means a line number per 2.54 cm) and a 50% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section, a pre-washing section for removing the overcoat layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate samples 1 through 12 and planographic printing plate comparative samples 1 through 4 were obtained. With respect to each sample, two kinds of processing were carried out, one in which preheating was carried out the power source of the preheating section being switched on, and the other in which preheating was not carried out the power source of the preheating section being switched off. The lowest exposure energy amount (µJ/cm²) reproducing the solid image above in the resulting planographic printing plate with no reduction of the layer thickness at the solid image portions was defined as recording energy and evaluated as a measure of sensitivity. The less the recording energy is, the higher the sensitivity. The results are shown in Tables 1 and 2.

| <Composition of developer (aqueous solution containing the following components)> | |
|---|---|
| Potassium silicate aqueous solution (containing 25.5-27.5% by weight of $SiO_2$ and 12.5-14.5% by weight of $K_2O$) | 8.0% by weight |
| Newcol B-13SN (produced by Nippon Nyukazai Co., Ltd.) | 3.0% by weight |
| Potassium hydroxide | amount giving pH 12.3 |

<<Printing Durability>>

The printing plate material sample obtained above was exposed at an exposure amount of 100 mJ/cm², employing an image with a screen line number of 175, and developed with the developer, whereby a printing plate was obtained. Employing the resulting printing plate, printing was carried out on a press (DAIYA1F-1 produced by Mitsubishi Jukogyo Co., Ltd.), wherein a coat paper, printing ink (Soybean oil ink, "Naturalith 100" produced by Dainippon Ink Kagaku Co., Ltd.), and dampening water (SG-51, H solution produced by Tokyo Ink Co., Ltd., Concentration: 1.5%) were used. The number of prints printed time when printing started until time when dot reduction at highlight portions was defined as a measure of printing durability.

TABLE 1

(preheating was carried out)

| | Polymerization initiator | | | |
|---|---|---|---|---|
| Sample No. | Polymerization initiator in the invention (parts by weight) | Polymerization initiator used in combination (parts by weight) | Exposure energy (mJ/cm²) | Printing durability (Sheet Number) |
| 1 (Inv.) | BR1 (3.0) | CI-3 (3.0) | 80 | 200,000 or more |
| 2 (Inv.) | BR18 (3.0) | CI-8 (3.0) | 80 | 200,000 or more |

TABLE 1-continued (preheating was carried out)

| | Polymerization initiator | | | |
|---|---|---|---|---|
| Sample No. | Polymerization initiator in the invention (parts by weight) | Polymerization initiator used in combination (parts by weight) | Exposure energy (mJ/cm$^2$) | Printing durability (Sheet Number) |
| 3 (Inv.) | BR22 (3.0) | CI-3 (2.0) CI-11 (2.0) | 50 | 200,000 or more |
| 4 (Inv.) | BR22 (4.0) | | 50 | 200,000 or more |
| 5 (Inv.) | BR26 (3.0) | CI-3 (2.0) CI-15 (2.0) | 50 | 200,000 or more |
| 6 (Inv.) | BR43 (4.0) | | 50 | 200,000 or more |
| 7 (Inv.) | BR62 (3.0) | CI-3 (3.0) | 50 | 200,000 or more |
| 8 (Inv.) | CL1 (3.0) | CI-3 (3.0) | 80 | 200,000 or more |
| 9 (Inv.) | CL22 (3.0) | CI-3 (2.0) CI-11 (2.0) | 50 | 200,000 or more |
| 10 (Inv.) | CL22 (4.0) | | 50 | 200,000 or more |
| 11 (Inv.) | CL29 (3.0) | CI-3 (2.0) CI-15 (2.0) | 50 | 200,000 or more |
| 12 (Inv.) | CL43 (4.0) | | 50 | 200,000 or more |
| 1 (Comp.) | | CI-3 (4.0) | 200 | * |
| 2 (Comp.) | | CI-3 (3.0) CI-11 (3.0) | 120 | 20,000 |
| 3 (Comp.) | | CI-3 (3.0) CI-15 (3.0) | 120 | 20,000 |
| 4 (Comp.) | | CI-26 (4.0) | 200 | * |

Inv.: Inventive, Comp.: Comparative
*Printing could not be carried out.

TABLE 2

(preheating was not carried out)

| | Polymerization initiator | | | |
|---|---|---|---|---|
| Sample No. | Polymerization initiator in the invention (parts by weight) | Polymerization initiator used in combination (parts by weight) | Exposure energy (mJ/cm$^2$) | Printing durability (Sheet Number) |
| 1 (Inv.) | BR1 (3.0) | CI-3 (3.0) | 100 | 70,000 |
| 2 (Inv.) | BR18 (3.0) | CI-8 (3.0) | 100 | 100,000 |
| 3 (Inv.) | BR22 (3.0) | CI-3 (2.0) CI-11 (2.0) | 50 | 200,000 or more |
| 4 (Inv.) | BR22 (4.0) | | 60 | 200,000 or more |
| 5 (Inv.) | BR26 (3.0) | CI-3 (2.0) CI-15 (2.0) | 60 | 200,000 or more |
| 6 (Inv.) | BR43 (4.0) | | 60 | 200,000 or more |
| 7 (Inv.) | BR62 (3.0) | CI-3 (3.0) | 80 | 200,000 or more |
| 8 (Inv.) | CL1 (3.0) | CI-3 (3.0) | 100 | 200,000 or more |
| 9 (Inv.) | CL22 (3.0) | CI-3 (2.0) CI-11 (2.0) | 60 | 70,000 |
| 10 (Inv.) | CL22 (4.0) | | 70 | 200,000 or more |
| 11 (Inv.) | CL29 (3.0) | CI-3 (2.0) CI-15 (2.0) | 80 | 200,000 or more |
| 12 (Inv.) | CL43 (4.0) | | 70 | 200,000 or more |
| 1 (Comp.) | | CI-3 (4.0) | 350 | * |
| 2 (Comp.) | | CI-3 (3.0) CI-11 (3.0) | 200 | * |
| 3 (Comp.) | | CI-3 (3.0) CI-15 (3.0) | 250 | * |
| 4 (Comp.) | | CI-26 (4.0) | 280 | * |

Inv.: Inventive, Comp.: Comparative
*Printing could not be carried out.

As is apparent from Tables 1 and 2, the inventive planographic printing plate material samples comprising an image formation layer containing the compound of formula (1), are lower in recording energy and larger in the sheet number to have been printed, resulting in high sensitivity and high printing durability.

EFFECTS OF THE INVENTION

The present invention can provide a planographic printing plate material with high sensitivity giving high printing durability, and to provide a process of preparing a planographic printing plate with high printing durability from the planographic printing plate material.

What is claimed is:

1. A planographic printing plate material comprising a support and provided thereon, an image formation layer containing a colorant (a) having an absorption band in a wavelength region of from 700 to 1200 nm, a polymerization initiator (b) and a polymerizable ethylenically unsaturated compound (c), wherein the polymerizable ethylenically unsaturated compound (c) has a urethane bond in the molecule and wherein the polymerization initiator (b) is a compound represented by the following formula (1),

$$R^1-CX_2-(C=O)-R^2 \qquad \text{Formula (1)}$$

wherein $R^1$ represents a hydrogen atom, a bromine atom, or a chlorine atom; $R^2$ represents a hydrogen atom or a first monovalent organic substituent, provided that $R^1$ and $R^2$ may combine with each other to form a ring; and X represents a bromine atom or a chlorine atom.

2. The planographic printing plate material of claim 1, wherein $R^2$ represents —(Y)—$R^3$ in which Y represents an oxygen atom or —$NR^4$— in which $R^4$ represents a hydrogen atom or an alkyl group, and $R^3$ represents a hydrogen atom or a second monovalent organic substituent.

3. The planographic printing plate material of claim 1, wherein the colorant is a cyanine dye.

4. The planographic printing plate material of claim 1, wherein the colorant is carbon black.

5. The planographic printing plate material of claim 1, wherein the image formation layer further comprises at least one compound selected from the group consisting of a sulfonium salt, a iodonium salt, an iron-arene compound and a titanocene compound.

6. The planographic printing plate material claim 1, wherein an overcoat layer containing polyvinyl alcohol as the main component is provided on the image formation layer.

7. A process of preparing a planographic printing plate, the process comprising the steps of imagewise exposing the planographic printing plate material of claim 1 to laser having an emission wavelength of from 700 to 1200 nm, and developing the exposed planographic printing plate material with an alkali developer.

8. A process of preparing a planographic printing plate, the process comprising the steps of imagewise exposing the planographic printing plate material of claim 6 to laser having an emission wavelength of from 700 to 1200 nm, washing the exposed planographic printing plate material with water to remove the overcoat layer, and developing the washed planographic printing plate material with an alkali developer.

* * * * *